United States Patent
Hasegawa et al.

(10) Patent No.: US 7,662,749 B2
(45) Date of Patent: Feb. 16, 2010

(54) RARE EARTH-CONTAINING TAPE-SHAPED OXIDE SUPERCONDUCTOR

(75) Inventors: Takayo Hasegawa, Tokyo (JP); Yasuo Takahashi, Tokyo (JP)

(73) Assignees: International Superconductivity Technology Center, the Juridical Foundation (JP); SWCC Showa Cable Systems Co., Ltd. (JP)

( * ) Notice: Subject to any disclaimer, the term of this patent is extended or adjusted under 35 U.S.C. 154(b) by 0 days.

(21) Appl. No.: 12/087,337

(22) PCT Filed: Jan. 10, 2007

(86) PCT No.: PCT/JP2007/050139

§ 371 (c)(1), (2), (4) Date: Jul. 2, 2008

(87) PCT Pub. No.: WO2007/080876

PCT Pub. Date: Jul. 19, 2007

(65) Prior Publication Data

US 2009/0069187 A1    Mar. 12, 2009

(30) Foreign Application Priority Data

Jan. 13, 2006   (JP) .............................. 2006-005831

(51) Int. Cl.
*B05D 5/12* (2006.01)
*H01B 12/06* (2006.01)
*H01B 13/00* (2006.01)

(52) U.S. Cl. .................... 505/237; 505/470; 427/62

(58) Field of Classification Search ......... 505/237–239, 505/470; 428/469; 427/62, 126.3
See application file for complete search history.

(56) References Cited

U.S. PATENT DOCUMENTS

| | | | | |
|---|---|---|---|---|
| 6,270,908 B1 * | 8/2001 | Williams et al. | ............ | 428/469 |
| 6,632,539 B1 * | 10/2003 | Iijima et al. | ................. | 428/472 |
| 7,473,670 B2 * | 1/2009 | Takahashi et al. | ............ | 505/470 |
| 2006/0258538 A1 | 11/2006 | Yasuo et al. | ................. | 505/100 |

FOREIGN PATENT DOCUMENTS

| | | |
|---|---|---|
| JP | 04-329867 | 11/1992 |
| JP | 04-331795 | 11/1992 |
| JP | 2002-202439 | 7/2002 |
| JP | 2004-171841 | 6/2004 |
| JP | 2005-056741 | 3/2005 |
| JP | 2005-276465 | 10/2005 |

* cited by examiner

*Primary Examiner*—Mark Kopec
(74) *Attorney, Agent, or Firm*—Bacon & Thomas, PLLC

(57) ABSTRACT

On a first intermediate layer provided on a substrate and having an excellent surface smoothness, are formed a second intermediate layer and an YBCO superconductor layer having excellent properties. An YBCO superconductor (10) having a critical current density (Jc) of 1 MA/cm$^2$ or higher can be produced by forming a first intermediate layer (2), a second intermediate layer (3), an YBCO superconductor layer (4) and an Ag-stabilized layer (5) on the surface of a tape-shaped biaxially oriented Ni—W alloy substrate (1), wherein the first intermediate layer (2) has a thickness of 5 nm or less, has a surface smoothness, comprises $A_2Zr_2O_7$, and is formed by repeating coating and provisional burning several times by the MOD method, the second intermediate layer (3) comprises a $CeO_2$ film and is formed by the pulse plating method, the YBCO superconductor layer (4) is formed by the MOD method, and the Ag-stabilized layer (5) is formed on the YBCO superconductor layer (4).

14 Claims, 1 Drawing Sheet

RARE EARTH-CONTAINING TAPE-SHAPED OXIDE SUPERCONDUCTOR

TECHNICAL FIELD

This invention relates to an oxide superconductor. In particular, this invention relates to a tape-shaped rare earth-containing oxide superconductor which is appropriate to a use for electric power devices such as a superconducting electric power cable or a superconducting electric power storage and a use for power equipment such as a motor.

BACKGROUND ART

In a structure of $YBa_2Cu_3O_{7-X}$ (YBCO) superconducting wire among the oxide superconducting wire, one layer or plural layers of a biaxially-oriented thin film of the inorganic material is formed onto the metallic substrate. And a superconducting film and a stabilized layer are formed in sequence onto the biaxially-oriented thin film of the inorganic material. Because this wire has the biaxially-oriented crystal, the critical current (Ic) value is higher than the bismuth type silver sheathed wire, and the magnetic-field property is superior in the liquid nitrogen temperature. Therefore, by using this wire, it is expected that the superconducting equipment which is used in the low temperature at present can be used in the high temperature state.

The characteristic of this YBCO superconductor is affected strongly by the orientation of that crystal. Therefore, the characteristic of this YBCO superconductor is affected strongly by this substrate which constitutes the lower layer and by the orientation of the crystal of an intermediate layer.

That is, a crystal system of the YBCO superconductor is an orthorhombic crystal. Therefore, in order to bring out the characteristic of the material in conducting property, it is required that not only a CuO face of the crystal but also an in-plane crystal orientation is arranged. The reason is that a little mismatch of the orientation generates grain boundaries of the twin crystal and deteriorates the conducting property.

Various methods for the film formation of The YBCO superconducting wire are studied now. IBAD (Ion Beam Assisted Deposition) method or RABiTS (Trade Mark: Rolling Assisted Biaxially Textured Substrate) method is known as the manufacturing technology of the biaxially-oriented metal substrate that the in-plane oriented intermediate layer is formed onto the tape-shaped metal substrate. And many YBCO superconducting wires having the intermediate layer whose in-plane orientation degree and orientation are improved and which is formed onto non-oriented or oriented metal tape are reported. For example, the following rare earth-containing tape-shaped oxide superconductor is known. As the substrate, that rare earth-containing tape-shaped oxide superconductor uses the substrate which consists of Ni or Ni based alloy having oriented texture by heat treatment after strong rolling process. And the Ni oxide thin film, the oxide intermediate layer which is formed by MOD method of $CeO_2$ and so on and the YBCO superconducting layer are formed in sequence onto the surface of this substrate (for example, refer to Patent document No. 1).

Among the background arts, the method using IBAD substrate has the best characteristic. In this method, onto the tape-shaped Ni based substrate (hastelloy etc.) having non-magnetism and high strength, the intermediate layer ($CeO_2$, $Y_2O_3$, YSZ etc.) or the intermediate layer of two layer structure (YSZ or $Gd_2Zr_3O_7/CeO_2$ or $Y_2O_3$ etc.) is formed by depositing the particles generated from the target using laser evaporation during irradiation of ion from the diagonal direction for this Ni based substrate. And these intermediate layers have high orientation and inhibit the reaction with the elements which constitute the superconductor. And after forming the $CeO_2$ film onto that layer by PLD method, the YBCO layer is formed by PLD method. Thereby, the superconducting wire is produced (for example, refer to Patent document No. 2 to No. 4).

However, in this method, because all layers are formed by vacuum process of gas phase method, there is advantage that the dense and smooth intermediate layer film can be obtained. But there are problems that the film formation speed is slow, the equipment cost becomes high and the wire cost rises. Although some film formation methods have been studied other than this IBAD method, the available methods for solving about the problems of the cost and the formation speed have not been reported.

The most effective method to actualize the low cost is MOD method (Metal Organic Deposition Processes) which forms the oxide layer by using the metal organic acid salt or the organic metal lie compound as the raw material, and by giving the heat treatment after coating the raw material.

Although this process is simple, it is difficult to obtain the film which has the sufficient capability as the intermediate layer because of the crack occurrence by the volume decrease at the time of heat decomposition and because of the diffusion of the elements of the substrate and the imperfection of the crystal by the imperfection of crystal grain growth.

Generally, $CeO_2$ is used as the intermediate layer of the Y type superconductor as described above. This is because the $CeO_2$ intermediate layer is very consistent with the YBCO superconducting layer, and because the $CeO_2$ intermediate layer is known as one of the best intermediate layer because of small reactivity for the YBCO layer. If the film of this $CeO_2$ intermediate layer is formed by MOD method, because the cracks occur from the difference of the coefficient of linear expansion between the film and the substrate, the function of the intermediate layer cannot be achieved. If the solid solution film that Gd was added into $CeO_2$ is formed onto the Ni based substrate by MOD method, the occurrence of the cracks can be restrained. However, the diffusion of the elements from the Ni or Ni based substrate cannot be restrained.

Besides, Zr type intermediate layer is also studied and the effect of the prevention of the element diffusion from the substrate is reported. About the wire using this Zr type intermediate layer, it is reported from some research organizations that Jc exceeding 1 $MA/cm^2$ is obtained.

Patent document No. 1: Japanese Patent Publication No. 2004-171841

Patent document No. 2: Japanese Patent Publication No. Hei04-329867

Patent document No. 3: Japanese Patent Publication No. Hei04-331795

Patent document No. 4: Japanese Patent Publication No. 2002-202439

DISCLOSURE OF THE INVENTION

Problem to be Solved by the Invention

As described above, in the MOD process, one of the factors to decide the superconducting characteristics including all orientation of the intermediate layer and the superconducting layer is the surface smoothness of the substrate. The orientation of the intermediate layer begins from the neighborhood of the substrate. Therefore, if it is possible to improve the surface smoothness of the substrate, it is possible to improve the characteristic of the film formed onto the substrate, and also it is possible to thin the film thickness of the intermediate layer. Hitherto, in many cases, the surface polishing of the tape-shaped face was carried out by using mechanical polishing method. Because the temperature of the surface of the substrate increases by this reason, there was a problem that the orientation of the substrate is damaged.

This invention was conducted to solve the above described problems. And this invention aims to provide the rare earth-containing tape-shaped oxide superconductor which has the excellent superconducting characteristics by arranging the first intermediate layer which has the excellent surface smoothness onto the substrate, and by improving the orientation of the second intermediate layer formed onto the first intermediate layer and the orientation of the superconducting layer.

Means for Solving the Problems

In the rare earth-containing tape-shaped oxide superconductor of this invention, onto the biaxially-oriented substrate which is formed by giving the heat treatment after cold working in Ni, Ni based alloy, Cu or Cu based alloy, the first intermediate layer comprising $A_2Zr_2O_7$ (wherein A shows any one kind of Ce, Gd or Sm) film having the surface smoothness of 5 nm or less, the second intermediate layer comprising $CeO_2$ film or Ce—Gd—O film, and the oxide superconducting layer are formed in sequence.

About forming the above described first intermediate layer, it is preferable that the process of the calcination after coating the mixed solution which dissolved into the organic solvent each metal organic acid salt or organic metallic compound including one kind of element selected from Ce, Gd or Sm and Zr is repeated several times.

EFFECT OF THE INVENTION

According to this invention, because the first intermediate layer which has excellent surface smoothness is formed onto the biaxially-oriented substrate, the orientation of the second intermediate layer and the superconducting layer which are formed onto this substrate improves. Consequently, the rare earth-containing tape-shaped oxide superconductor which has the critical current density (Jc) of 1 $MA/cm^2$ or more and the excellent superconducting characteristic can be obtained.

BEST MODE FOR CARRYING OUT THE INVENTION

Figure 1:
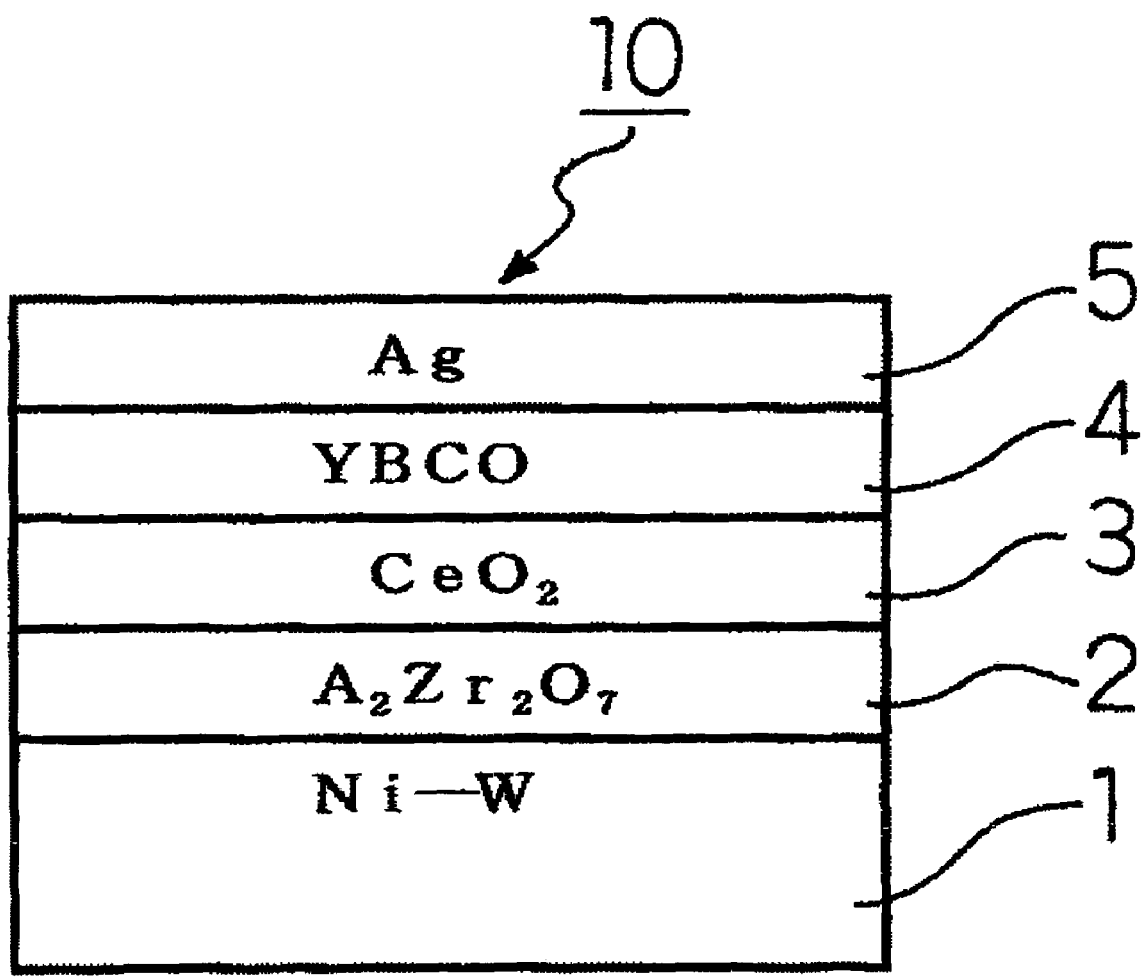
FIG. 1 The cross-section drawing which is perpendicular to the axial direction of the tape which shows an embodiment of the rare earth-containing tape-shaped oxide superconductor according to this invention.

In the rare earth-containing tape-shaped oxide superconductor of this invention, the first intermediate layer of $A_2Zr_2O_7$ having the surface smoothness of 5 nm or less, the second intermediate layer, and the oxide superconducting layer are formed onto the biaxially-orientated substrate in sequence. And, generally, the metallic stabilized layer is laminated onto this oxide superconducting layer.

As above described biaxially-oriented substrate, Ni, Ni-based alloy containing one or more kinds of elements into Ni, Cu or Cu-based alloy containing one or more kinds of elements into Cu is used by giving the heat treatment after cold-rolling and making the predetermined thickness. In this case, the heat treatment is given in the temperature range of 900-1300 degrees C. and in the inert gas atmosphere including hydrogen in order to prevent the surface oxidation of the substrate. By this heat treatment, Ni or Ni-based alloy or Cu or Cu-based alloy can be oriented highly. This heat treatment can adopt both continuous method and batch method.

Besides, as the above described Ni-based alloy or Cu-based alloy, the alloy which added any one or more kinds of elements selected from W, Sn, Zn, Mo, Cr, V, Ta or Ti into Ni or Cu can be used. In this case, it is preferable that the added element quantity is the range of 0.1-15 at %. When the added element quantity is less than 0.1 at %, because the strength of the substrate is weak, there is the possibility that the deterioration is caused by the subsequent process. And when the added element quantity exceeds 15 at %, it is difficult to obtain the biaxially-orientation by the cold-rolling and the heat treatment, and then, because the added element diffuses into the intermediate layer by the subsequent process, the superconducting characteristic deteriorates.

And, especially, when the smoothness of the substrate is needed, it is also possible to give the mechanical polishing, the electrolytic polishing, or the compound polishing using both polishing to this substrate.

In order to raise the Jc value, as described above, the first intermediate layer is formed by repeating several times the process of the calcination after coating the mixed solution which dissolved into the organic solvent each metal organic acid salt or organic metallic compound including one kind of element selected from Ce, Gd or Sm and Zr.

The raw material of the first intermediate layer by the MOD method includes octylic acid salt, naphthenate, neodecanoic acid salt, trifluoroacetate or the like. And if the raw material of the first intermediate layer dissolves into one kind or two kinds or more of organic solvent uniformly, and can be coated onto the substrate, it is possible to use. The amount of metal lie element included in this mixed solution is 0.08-0.5 mol/l, and is preferably 0.1-0.3 mol/l. When the amount of metal lie element in the mixed solution is less than 0.08 mol/l, an oxide film which is formed by one coating and heat treatment becomes thin and the uform intermediate layer is not obtained. When the amount of metallic element in the mixed solution exceeds 0.5 mol/l, the oxide film which is formed by one coating and heat treatment becomes thick and the surface smoothness is damaged and also crystallinity decreases. Although the film thickness is controlled by the number of times which repeats the coating and the heat treatment, considering the surface smoothness, it is effective to obtain the desired thickness by 3-5 times of coating. And the film thickness is preferably 30-300 nm.

The coating method includes spin coat method, dipping method, ink jet method or the like. And if that method can form the film onto the substrate uniformly, it is possible to use. And the first intermediate layer also can be formed by any one method of pulse laser evaporation, sputtering method or CVD method.

The second intermediate layer as film which is formed onto the first intermediate layer is formed with $CeO_2$ film or with Ce—Gd—O film that Gd of predefined amount is added to $CeO_2$ film. This second intermediate layer can be formed by any one method of MOD method, pulse laser evaporation, sputtering method or CVD method. And it is preferable that the additive amount of Gd in the Ce—Gd—O film is 50 at % or less. If the additive amount of Gd exceeds this value, crystal system changes. And when the YBCO superconducting layer is formed onto this Ce—Gd—O film, good orientation cannot be obtained. It is preferable that this film thickness is 50 nm–3 μm. When the film thickness is less than 50 nm, there are few effects for the prevention of diffusion of the element of the substrate. When the film thickness exceeds 3 μm, the crack in the film may occur.

The YBCO layer onto the second intermediate layer can be formed by any one method of MOD method, pulse laser evaporation, sputtering method or CVD method.

The raw material solution in the case of using the MOD method is the mixed solution of the organic acid salt or the organic metallic compound and the organic solvent, and the organic acid salt or the organic metallic compound includes Y, Ba, and Cu of the predefined molar ratio. The number of moles of the metallic elements of the mixed solution is Y:Ba:Cu=1:(2+a):(3+b), and is $0.01<a<0.3$, $0.01<b<0.5$. When the number of moles deviates from this range, the problems that the superconducting layer is not formed or many impurities are formed are caused. For example, the raw material according to the MOD method includes octylic acid salt, naphthenate, neodecanoic acid salt, trifluoroacetate or the like. And if the raw material according to the MOD method dissolves into one kind or two kinds or more of organic solvent uniformly, and can be coated onto the substrate, it is possible to use.

Hereinafter, embodiments of this invention are explained.

EMBODIMENT

Embodiment 1-3

FIG. 1 shows the cross section which is perpendicular to the direction of the axis of the tape of rare earth-containing tape-shaped oxide superconductor of this invention. The rare earth-containing tape-shaped oxide, superconductor 10 has the structure formed as follows. Onto the surface of the biaxially-oriented tape-shaped substrate 1 by giving the heat treatment at the temperature of 900-1300 degrees C. for orientation after forming Ni—W alloy having predefined thickness by cold-rolling, the first intermediate layer 2 which consists of $A_2Zr_2O_7$ having the surface smoothness of 5 nm or less was formed by repeating several times the process of the calcination after coating the mixed solution which dissolved into the organic solvent each metal organic acid salt or organic metallic compound including one kind of element selected from Ce, Gd or Shi and Zr. And the second intermediate layer 3 which consists of $CeO_2$ film was formed onto this first intermediate layer 2 by the pulse laser evaporation. Besides, the YBCO superconducting layer 4 was formed by MOD method, and Ag stabilized layer 5 was formed onto this YBCO superconducting layer.

As the substrate shown in FIG. 1, the tape which has the thickness of 70 μm, the width of 10 mm and the length of 100 m was manufactured by giving cold-rolling to Ni-3 at % W alloy. And the biaxially-orientated tape-shaped substrate was manufactured by giving the heat treatment at the temperature of 1100 degrees C. for orientation in $Ar/H_2$ airflow to this tape. Onto this tape-shaped substrate, the first intermediate layer was formed by repeating the predefined number of process of the calcination after coating the mixed solution of each octylic acid salt of Ce and Zr having predefined metallic content by dipping method. The surface smoothness of this time was measured.

Next, the second intermediate layer which consists of $CeO_2$ was formed onto this first intermediate layer by the pulse laser evaporation so that the film thickness is 200 μm. The YBCO superconducting film was formed onto this film by MOD method, and the Jc value was measured in the liquid nitrogen.

The measured result about the surface smoothness and the Jc value of the first intermediate layer are shown together with the metallic content, the number of times of the coating and the film thickness in table 1.

TABLE 1

|  |  | Metallic Content (mol/l) | Number of Times of Coating (Number of Times) | Surface Smoothness (nm) | Film Thickness (nm) | Jc (MA/cm$^2$) |
|---|---|---|---|---|---|---|
| Embodiment | 1 | 0.1 | 4 | 2 | 60 | 1.3 |
|  | 2 | 0.25 | 3 | 3 | 60 | 1.1 |
|  | 3 | 0.5 | 2 | 5 | 60 | 1.0 |
| Cmparative Example | 1 | 0.05 | 12 | 10 | 50 | 0.3 |
|  | 2 | 0.65 | 1 | 5 | 70 | 0.2 |

Comparative Example 1 and 2

By changing the metallic content and the number of times of the coating, the first intermediate layer was formed by same method as the above described embodiment except for the metallic content and the number of times of the coating. Subsequently, the second intermediate layer and the YBCO superconducting film were formed by the same method as the embodiment. And the Jc value was measured in the liquid nitrogen.

The measured result about the surface smoothness and the Jc value of the first intermediate layer was shown together with the metallic content, the number of times of the coating and the film thickness in table 1.

As is evident from the result of above embodiments and comparative examples, the YBCO superconductor which used the first intermediate layer consisting of $A_2Zr_2O_7$ having surface roughness (surface smoothness) of 5 nm or less shows the excellent Jc value of 1 MA/cm2 or more. The first intermediate layer is formed onto the substrate by repeating several times the process of the calcination after coating the mixed solution which dissolved into the organic solvent the each metal organic acid salt including one kind of element selected from Ce, Gd or Sm and Zr. The metallic content in the above described mixed solution in this case is within the range of 0.08-0.5 mol/l.

Meanwhile, in the one which repeated many coatings and calcinations using the mixed solution of the above described metallic content of less than 0.08 mol/l, the Jc value is markedly decreased (comparative example 1). And, in the case that the metallic content in the mixed solution is within the range of the above described embodiments, the one which gives one time coating and calcination has the excellent surface smoothness, but the Jc value is markedly decreased similarly (comparative example 2).

INDUSTRIAL APPLICABILITY

The rare earth-containing tape-shaped oxide superconductor according to this invention can be used for the cable, the electric power equipment and the power equipment.

The invention claimed is:

1. A rare earth-containing tape-shaped oxide superconductor, comprising in sequence:
   a biaxially-oriented substrate, which is formed by a heat treatment after cold working, of Ni, Ni based alloy, Cu or Cu based alloy;
   a first intermediate layer, formed on the substrate, comprising a $A_2Zr_2O_7$ (wherein A is an element selected from the group consisting of Ce, Gd and Sm), the intermediate layer having a surface smoothness of 5 nm or less and wherein the intermediate layer is formed by repeated calcination of a coating of a mixed organic solvent solution which contains, dissolved therein, metal organic acid salts or organic metallic compounds including Zr and at least one metallic element selected from Ce, Gd and Sm;

a second intermediate layer formed on the first intermediate layer, comprising a $CeO_2$ film or Ce—Gd—O film; and an oxide superconducting layer, formed on the second intermediate layer.

2. The rare earth-containing tape-shaped oxide superconductor according to claim 1, wherein the mixed organic solvent is a mixed solution of octylic acid salt, naphthenate, neodecanoic acid salt or trifluoroacetate of Zr and each element A which constitutes the first intermediate layer.

3. The rare earth-containing tape-shaped oxide superconductor according to claim 2, wherein the amount of metallic element in the mixed solution is 0.08-0.5 mol/l.

4. The rare earth-containing tape-shaped oxide superconductor according to claim 3, wherein the amount of metallic element is 0.1-0.3 mol/l.

5. The rare earth-containing tape-shaped oxide superconductor according to claim 1, wherein the second intermediate layer is the film layer which is formed by MOD, pulse laser evaporation, sputtering or CVD.

6. The rare earth-containing tape-shaped oxide superconductor according to claim 1, wherein the substrate is a Ni-based alloy or a Cu-based alloy containing 0.1-15 atomic % of at least one metallic element selected from the group consisting of W, Sn, Zn, Mo, Cr, V, Ta and Ti, with the balance being Ni or Cu.

7. The rare earth-containing tape-shaped oxide superconductor according to claim 1, wherein the biaxially-oriented substrate is heat treated at a temperature of 900-1300 degrees C.

8. The rare earth-containing tape-shaped oxide superconductor according to claim 1 wherein the oxide superconductor layer is a YBCO superconductor having a Jc value of at least 1 $MA/cm^2$.

9. A method for making a rare earth-containing tape-shaped oxide superconductor, comprising the following steps in sequence:
  a. cold working a substrate of Ni, Ni based alloy, Cu or Cu based alloy;
  b. heat treating the substrate to form a biaxially-oriented substrate;
  c. coating the biaxially-oriented substrate with a mixed organic solvent solution which contains, dissolved therein, metal organic acid salts or organic metallic compounds including Zr and at least one metallic element selected from Ce, Gd and Sm;
  d. calcining the coating on the substrate to form, on the substrate, a first intermediate layer comprising a $A_2Zr_2O_7$ film, wherein A is an element selected from the group consisting of Ce, Gd and Sm;
  e. repeating steps c and d to form a first intermediate layer having a surface smoothness of 5 nm or less;
  f. forming, on the first intermediate layer, a second intermediate layer comprising a $CeO_2$ film or Ce—Gd—O film; and
  g. forming, on the second intermediate layer, an oxide superconducting layer.

10. The method of claim 9 wherein the mixed organic solvent solution contains 0.08-0.5 mol/l of metallic elements.

11. The method of claim 9 wherein the mixed organic solvent solution contains 0.1-0.3 mol/l of metallic elements.

12. The method of claim 9 wherein the heat treating is at 900-1300° c.

13. The method of claim 9 wherein the first intermediate layer is built to a thickness of 30-300 nm by forming 3-5 $A_2Zr_2O_7$ films.

14. The method of claim 9 wherein the oxide superconductor layer is a YBCO superconductor having a Jc value of at least 1 $MA/cm^2$.

* * * * *